United States Patent [19]

Cake et al.

[11] Patent Number: 5,293,122
[45] Date of Patent: Mar. 8, 1994

[54] SIGNAL PROBE WITH REMOTE CONTROL FUNCTION

[75] Inventors: Brian V. Cake, Monroe, N.Y.; Stephen T. Dye, Buntingford, England

[73] Assignee: LeCroy Corporation, Chestnut Ridge, N.Y.

[21] Appl. No.: 895,101

[22] Filed: Jun. 8, 1992

[51] Int. Cl.$^5$ .................. G01R 1/067; G01R 1/38
[52] U.S. Cl. .................. 324/158 P; 324/72.5; 324/115; 324/149
[58] Field of Search .................. 324/72.5, 115, 121 R, 324/149, 158 P

[56] References Cited

U.S. PATENT DOCUMENTS

| | | | |
|---|---|---|---|
| 3,315,163 | 4/1967 | Lutz | 324/149 |
| 3,836,851 | 9/1974 | Schumann et al. | 324/112 |
| 4,042,881 | 8/1977 | Webb, Jr. | 324/72.5 |
| 4,114,095 | 9/1978 | Pankove et al. | 324/121 R |
| 4,139,817 | 2/1979 | Boer et al. | 324/72.5 |
| 4,162,531 | 7/1979 | Rode et al. | 324/121 R X |
| 4,298,837 | 11/1981 | Koslar | 324/72.5 |
| 4,438,396 | 3/1984 | Harnden, Jr. et al. | 324/115 X |
| 4,527,118 | 7/1985 | Koslar | 324/149 X |
| 4,634,971 | 1/1987 | Johnson et al. | 324/72.5 X |
| 4,646,005 | 2/1987 | Ryan | 324/123 R |
| 4,743,839 | 5/1988 | Rush | 324/72.5 |
| 4,758,779 | 7/1988 | Thong | 324/72.5 |
| 4,833,400 | 5/1989 | Boutigny | 324/72.5 X |
| 4,859,932 | 8/1989 | Whitley | 324/72.5 |
| 4,951,370 | 8/1990 | Reid | 324/158 P X |
| 5,105,181 | 4/1992 | Ross | 324/72.5 X |
| 5,144,226 | 9/1992 | Rapp | 324/115 X |
| 5,162,725 | 11/1992 | Hodson et al. | 324/115 |

OTHER PUBLICATIONS

"The XYZs of Using a Scope", Tektronix, (1991), pp. 17-18 (no month).

*Primary Examiner*—Kenneth A. Wieder
*Assistant Examiner*—Glenn W. Brown
*Attorney, Agent, or Firm*—Curtis, Morris & Safford

[57] ABSTRACT

A signal probe apparatus having a probe tip, a grounding attachment, a main body portion and a connector for use with a signal measuring device. The probe tip and the grounding attachment are coupled by way of first and second signal lines to the connector for supplying signals therefrom to the signal measuring device. A plurality of circuit elements, such as resistors, are connected between the second signal line and a third line in the connector; and switch means located on the main body portion enables a predetermined circuit value, for example, the resistance between the second and third lines, to be selectively changed to a respective value which corresponds to a respective one of several predetermined functions which may be performed by the signal measuring device. The selected circuit value is detected by the signal measuring device and the corresponding function is thereafter implemented.

17 Claims, 3 Drawing Sheets

SIGNAL PROBE WITH REMOTE CONTROL FUNCTION

BACKGROUND OF THE INVENTION

1. Field of the Invention

This invention relates to signal probe apparatus for use with a signal measuring device, such as an oscilloscope or the like.

2. Description of the Prior Art

In the prior art, signal probes are normally used with a signal measuring device, such as an oscilloscope, for measuring signals at desired locations in a circuit. Through the use of appropriate probe tips, these probes may be easily secured to the desired locations. Such probes may be intended for use with one or more particular oscilloscopes wherein certain considerations, such as those relating to bandwidth and to load termination between the probe and the oscilloscope, have already been taken into account. Further, resistive cabling and/or proper shielding may be designed into the probes so as to minimize the amount of stray signals which may otherwise be mixed with the desired signals to be measured and thus detected. Nevertheless, probes may insert a load into the circuit which may affect the signal to be measured. For example, when measuring relatively high frequency signals, circuit loading in the form of additional capacitance may be inserted by the probe. To minimize this additional capacitance, attenuation probes, such as a voltage sensing passive type, may be used. These probes attenuate signals by a predetermined attenuation amount, for example, 10X or 100X, and, as a result, reduce or minimize the induced additional capacitance. However, in so doing, the signal being measured is also attenuated by the same amount.

An example of an attenuation probe 10 is illustrated in FIG. 1A. As shown therein, the attenuation probe 10 generally comprises a main body 12, a cable 18, a compensation portion 20 and a connector 22. The main body 12 includes a probe tip 14, an attenuation portion 52 (FIG. 1B) and a switch 16. Further, a ground wire 11 having a ground attachment 13, for example, an alligator-type clip, is coupled to the main body 12. As is to be appreciated, in measuring high frequency signals, it may be desirable to minimize the length of the ground wire 11.

The compensation portion 20, which contains an adjustable portion 54 having an adjustable capacitor 50 (FIG. 1B) or similar device, is adapted to compensate for variations in the oscilloscope input capacitance. The probe 10, and particularly the compensation portion 20, further includes an element or elements, such as a sense resistor 24 (FIG. 1B), which is utilized to provide an indication to the oscilloscope of the amount of attenuation (i.e. the attenuation factor) associated with the probe.

To measure a signal at a desired test point, the probe tip 14 is placed on such test point and the ground clip 13 is securely attached to an acceptable ground connection. The signal from the test point is supplied from the probe tip 14 by way of a first wire or signal transmission line contained within the probe 10 through the attenuation portion 52 and the cable 18 to the adjustment portion 54 of the compensation portion 20. Similarly, ground is coupled from the ground attachment 13 through the ground wire 11 to the main body 12 and from there by way of a second (ground) line contained within the probe 10 through the cable 18 to the adjustment portion 54 of the compensation portion 20. As shown in FIG. 1B, a third signal line (commonly referred to as a sense line) is coupled to the ground line in the main body 12 through the sense resistor 24 included in the compensation portion 20 and is adapted to provide an indication or sense signal therefrom. The measured signal, ground signal and sense signal are thereafter supplied from the compensation portion 20 to the connector 22 which is adapted to mate with a corresponding connector on the oscilloscope. As a result, when the connector 22 is connected to the corresponding mating connector of the oscilloscope, the signals from the attenuation probe 10 are supplied to the oscilloscope.

In certain situations, for example, when using multiple probes which provide multiple signal displays, it may be desirable for the operator to confirm the origin of a signal currently being displayed by the oscilloscope. In these situations, the operator may press (close) the switch 16 of a probe, which is preferably a momentary-type switch, to short circuit, or by-pass, resistor 24, thereby changing the resistance between the ground line and the sense line, as hereinafter more fully described. Upon sensing such change in resistance, the oscilloscope typically displays an identification mark on its display screen, thereby providing an indication to the operator that the signal being displayed is obtained from the respective probe in which the switch 16 was pressed.

FIG. 1B illustrates a schematic diagram of the probe 10. In FIG. 1B, the probe tip 14 and the ground clip 13 correspond to terminals 26 and 28, respectively. The terminal 26 is coupled by way of the signal transmission line through the attenuation portion 52 and the adjustment portion 54 to an output terminal 30 contained within the connector 22. Similarly, the terminal 28 is coupled by way of the ground line through the adjustment portion 54 to a terminal 32 contained within the connector 22. A terminal 34, also contained within the connector 32, is coupled to the sense line which is connected to the ground line by way of the sense resistor 24. Further, the switch 16 is connected across the resistor 24 as shown in FIG. 1B, to selectively by-pass the resistor.

The attenuation portion 52 may include resistors 40 and 42 and a capacitor 44 connected as shown in FIG. 1B. The values of these components are dependent upon the amount of desired attenuation of the signal to be measured, that is, the signal applied to the probe tip (or to terminal 26). As an example, for a probe having an attenuation factor of X10 (i.e. $V_{out} = V_{in}/10$) for use with an oscilloscope having a 1 Mohm input resistance, these components may have the following values:

resistor 40:47 ohms
resistor 42: 9 Mohms
capacitor 44:12 pf

The adjustment portion 54 may include the adjustable capacitor 50 and resistors 46 and 48 connected as shown. The adjustable capacitor 50 may be adjusted by the operator so as to compensate for variations in the input capacitance of the oscilloscope, as previously discussed. As is to be appreciated, portions 52 and 54 may be configured differently from that shown in FIG. 1B and may be located in different locations of the probe 10. For example, the attenuation portion 52 may be located in the compensation portion 20.

The value of the resistor 24 identifies the attenuation factor associated with the probe 10. In other words, probes performing different levels of signal attenuation will have different respective resistance values for the resistor 24 so as to produce different respective values or ranges of values of a sense signal across the terminals 32 and 34 as, for example, those shown in Table 1.

TABLE 1

| Probe | Attenuation Factor | $R_{32-34}$ (ohms) |
|---|---|---|
| 1 | X1 | >15K |
| 2 | X10 | 11K +/− 10% |
| 3 | X100 | 5.6K−6.2K +/− 10% |

As shown therein, each of three different attenuation probes utilizes a value or range of values for the resistor 24 which is unique from the others. Further, such resistance values are sufficiently separated from one another so as to allow for component and measuring tolerances. As a result, by measuring the resistance across terminals 32 and 34 when the switch 16 is opened, the oscilloscope is provided with an indication of the amount of signal attenuation performed by the respective probe. For example, if a conventional sense, or measuring circuit in the oscilloscope detects a resistance $R_{24}$ across the terminals 32 and 34 of approximately 11K ohms, this indicates that the probe being utilized has an attenuation factor of 10X and a predetermined amount of compensation is provided for such attenuation. For example, horizontal and/or vertical sensitivity may be adjusted accordingly. On the other hand, when the switch 16 is closed (activated), the resistance across the terminals 32 and 34 is effectively a short circuit. In this situation, the sense or measuring circuit interprets such low resistance as a command to display an identification mark on the display screen, as hereinbefore discussed.

Typically, the resistance $R_{24}$ across the terminals 32 and 34 is sampled by the sense or measuring circuit at a predetermined sampling rate. The sampled resistance information, in analog form, is supplied to an analog-to-digital converter contained within the oscilloscope (not shown) so as to be converted into digital form. Thereafter, the digital information signal is supplied to a processor (not shown) which processes the information in accordance with a previously stored algorithm so as to compensate for the attenuation factor.

Although the above-described probe 10 reduces capacitive loading and provides an identification signal, such probe may be cumbersome to use in taking signal measurements and particularly when different functions performable by a multi-function oscilloscope are desired. For example, consider the situation in which an operator, who is working alone, is holding a probe in each hand on two respective test points and wishes to change or activate one or more functions of the oscilloscope. In such a situation, the operator typically frees one of his or her hands, thereby interrupting the measuring of the signals, so as to adjust the appropriate knob or activate a particular switch on the oscilloscope. The prior art has failed to provide a means for remotely controlling one or more functions of an oscilloscope which is convenient for an operator to use while actively measuring signals.

OBJECTS AND SUMMARY OF THE INVENTION

Therefore, an object of the present invention is to provide signal probe apparatus which overcomes the foregoing problems associated with the prior art.

More specifically, it is an object of the present invention to provide signal probe apparatus for remotely controlling an oscilloscope or the like by utilizing a plurality of switches located on the probe body, whereby respective functions in the oscilloscope may be activated.

In accordance with an aspect of this invention, signal probe apparatus is provided for use with and for remotely controlling a signal measuring device operable to perform a plurality of remote controlled functions. A plurality of signal lines in the probe are connected to the signal measuring device, and a signal to be measured is supplied to one of these lines and coupled thereby to the signal measuring device. Plural circuit elements, such as resistors, are individually connectable between a pair of the signal lines, with the selected circuit value, which, for example, may be a resistance value, representing a respective one of the functions to be performed by the signal measuring device. As a feature, an activate switch may be provided to shunt or change the circuit value across the pair of signal lines, so as to provide an indication to the signal measuring device to activate the function represented by the selected circuit value.

In accordance with another aspect of this invention, each circuit element is coupled to a respective one of a plurality of switches, and a desired function is activated by closing a corresponding switch to connect a particular element across the pair of signal lines.

Other objects, features and advantages of the present invention will become apparent from the following detailed description of the illustrated embodiments when read in conjunction with the accompanied drawings in which corresponding components are identified by the same reference numerals.

DETAILED DESCRIPTION OF THE PREFERRED EMBODIMENTS

Figure 1A:
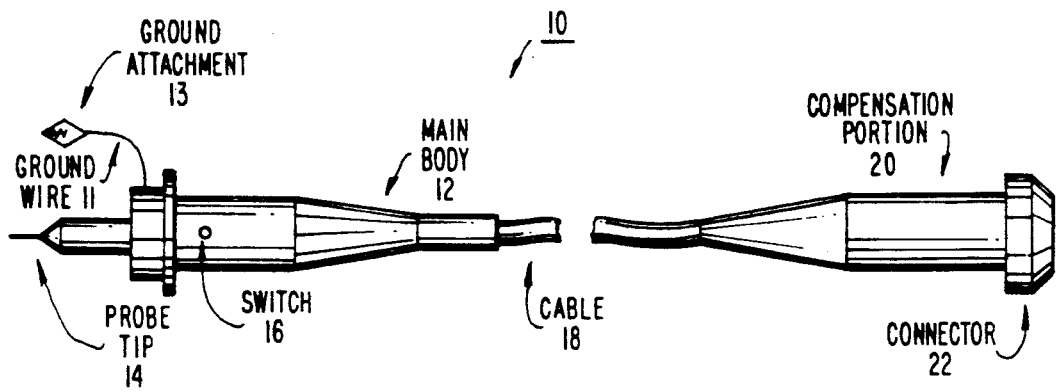
FIG. 1 illustrates an attenuation probe according to the prior art.
FIG. 1B is a schematic diagram of the attenuation probe of FIG. 1A.
Figure 2A:
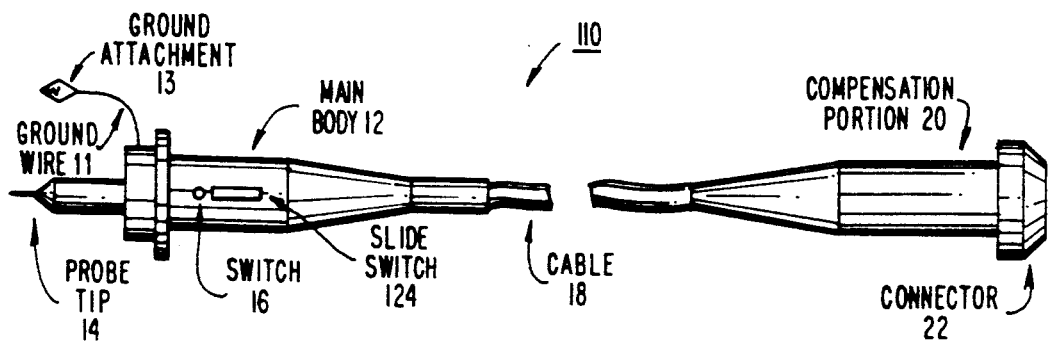
FIG. 2A illustrates an attenuation probe according to an embodiment of the present invention.

FIG. 2A illustrates one embodiment of a signal probe 110 for use with and for remotely controlling an oscilloscope (such as an oscilloscope manufactured by the assignee of the present invention) or other signal measuring device. As shown therein, with the exception of a slide switch 124 disposed on the main body 12, the components of the probe 110 which are observed by a user are substantially identical to the corresponding components of probe 10 of FIG. 1A. In the interest of simplification, only the differences between the probe 110 and the probe 10 will be described below.

The slide switch 124, in conjunction with the switch 16, is adapted for controlling one or more predetermined Signal probe apparatus according to claim 8, in which functions of the oscilloscope (for convenience, the term "oscilloscope" is intended to refer to other signal measuring devices with which probe 110 may be used). More specifically, the slide switch 124 may be set in one of a plurality of states or positions. Each of these states provides unique information to the oscilloscope which corresponds to a respective function to be performed or activated by the oscilloscope. The oscilloscope holds or stores this information until the switch 16 is activated, whereupon the oscilloscope initiates the function corresponding to the previously held information.

Figure 1B:
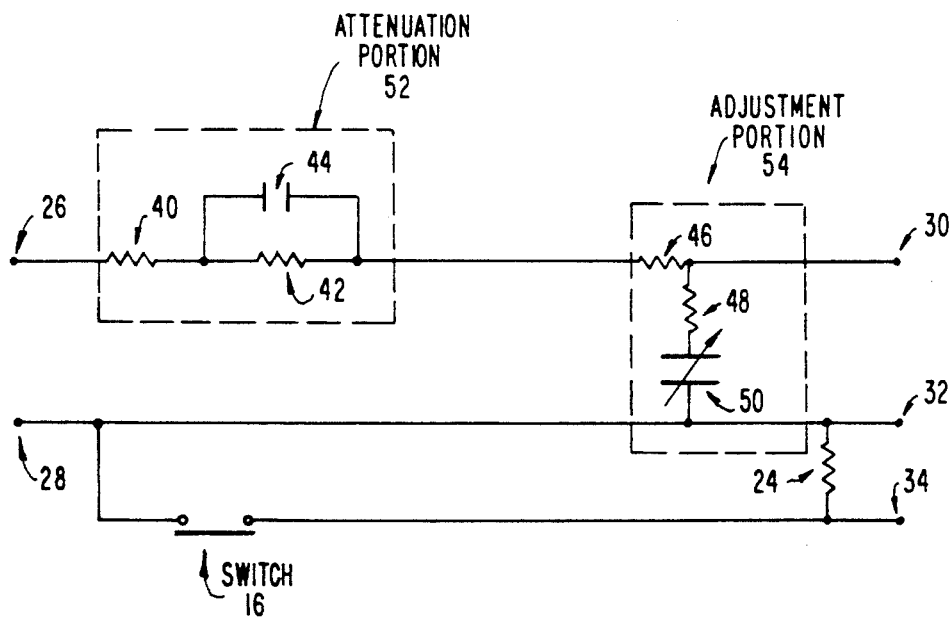
Figure 2B:
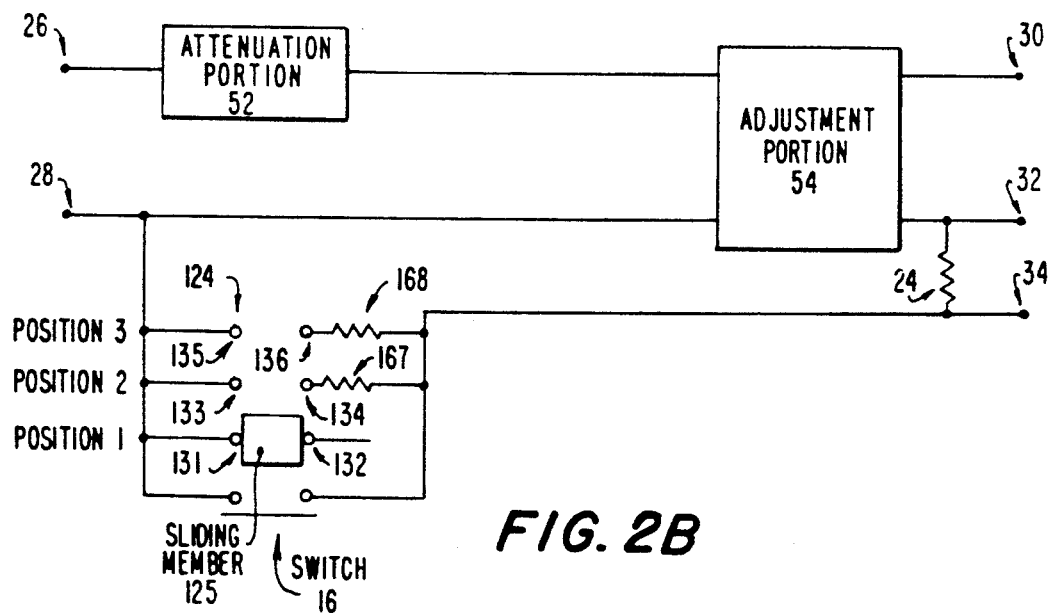
FIG. 2B is a schematic diagram of the attenuation probe of FIG. 2A.

FIG. 2B illustrates a schematic diagram of the probe 110. In a manner similar to that of probe 10, described with reference to FIG. 1B, the probe tip 14 and the ground attachment 13 correspond to terminals 26 and 28, respectively. The terminal 26 is coupled by way of a first signal line through the attenuation portion 52 and the adjustment portion 54, which are respectively contained within the main body 12, and the compensation portion 20, to an output terminal 30. Similarly, the terminal 28 is coupled by way of a second signal or ground line through the adjustment portion 54 to, the output terminal 32. A third signal line (the sense line) is connected to the ground line in the main body 12 by way of the resistor 24, and this sense line is coupled to an output terminal 34. As before, the resistor 24, contained within the compensation portion 20, provides a predetermined, standard resistance indicating the amount of attenuation performed by the attenuation portion 52. Switch 16 is connected in parallel with the resistor 24 and is adapted to shunt the resistance to a relatively low value. Each of the output terminals 30, 32 and 34 are contained within the connector 22.

However, unlike the schematic representation of FIG. 1B for the probe 10, the schematic diagram of FIG. 2B for the probe 110 illustrates a plurality of additional function-select resistors 167, 168, . . . , selectively connectable in parallel with standard resistor 24 by a slide switch 124. In this embodiment, the slide switch includes a sliding member 125 and a plurality of sets of contact terminals. In a preferred embodiment, there are three sets of contact terminals 131, 132; 133, 134 and 135, 136 corresponding to positions 1, 2 and 3, respectively, of sliding member 125. Terminals 134 and 136 are respectively connected to resistors 167 and 168 which, in turn, are connected to the sense line to which resistor 24 also is connected. To minimize costs, the terminal 132 is not connected through a resistor to the sense line, but is, instead, an open circuit. However, as is to be appreciated, the terminal 132 alternatively may be connected through a resistor to the sense line. Further, the sliding member 125 is preferably configured so as to contact only one set of contact terminals at a time. The other terminals 131, 133 and 135 are connected in common to the aforementioned second signal line or ground line to which the resistor also is connected. It will be seen, then, that the selective positioning of the sliding member 125 connects one of resistors 167, 168, . . . , in parallel with resistor 24.

The operation of the probe 110 will now be described with reference to FIG. 2B.

More specifically, the like probe 10, a signal to be measured is coupled form the probe tip to the input terminal 26 and supplied to the attenuation portion 52, wherein the measured signal is attenuated by a predetermined amount. The attenuated signal is thereafter supplied through the adjustment portion 54 to the output terminal 30 and thence to the measuring device. Ground is applied to the ground line and to the output terminal 23. When the probe 110 is connected to the oscilloscope, the oscilloscope receives the signal to be measured across the terminals 30 and 32 and also is adapted to detect the resistance (i.e. resistor 24) across the sense and ground lines, or terminals 32 and 34, which, in turn, represents the amount of attenuation performed by the attenuation portion 52 (that is, $1\times$, $10\times$, $100\times$, etc.).

However, unlike the probe 10, the resistance across the sense and ground lines, or across terminals 32 and 34, varies in accordance with the position of the sliding member 125. More specifically, when the sliding member 125 is placed in one of the indicated positions, the resistor corresponding to the selected position (i.e., resistor 167 or resistor 168 or the open circuit) is connected in parallel with the resistor 24. The values of the resistors 24, 167 and 168 are selected for probes of different attenuation factors so that, regardless of which resistor is connected in parallel with resistor 24, the effective resistance across the sense and ground liens will be one of, for example, three resistance values (one for a $1\times$ attenuation, another for a $10\times$ attenuation and a third for a $100\times$ attenuation) which lie within the resistance range of the respective attenuation factor as indicated in Table I. Examples of resistance values for the resistors 24, 167 and 168 are illustrated in Table II below.

TABLE II

| Attenuation | $R_{24}$ (ohms) | $R_{167}$ (ohms) | $R_{168}$ (ohms) |
|---|---|---|---|
| X1 | 22K | 56K | 120K |
| X10 | 12.1K | 56K | 120K |
| X100 | 6.8K | 22K | 56K |

Therefore, although the resistance across the sense and ground lines (i.e. across terminals 32 and 34) varies in accordance with the position of the sliding member 125 and, thus, the resistor selected thereby, the amount of variation is within the ranges of Table I. For example, if the probe 110 has an attenuation factor of $\times 10$, the resistance across the terminals 32 and 34 will have three distinct values depending on whether the sliding member 125 selects resistor 167, resistor 168 or the open circuit, but the effective resistance lies within a range of 9.9K ohms to 12.1K ohms. That is, the resistance across the terminals 32 and 34 is approximately 12.1K ohms, 9.95K ohms and 11.0K ohms, when the sliding member is in positions 1, 2 and 3, respectively, which values lie within the previously described acceptable resistance range representing an attenuation factor of $10\times$.

Thus, setting the sliding member 125 to one of the three positions changes the resistance across the terminals 32 and 34 to a respective one of three values and each of these three resistance values identifies a respective, predetermined function which may be performed by the oscilloscope. Examples of such functions may include auto-setup (i.e., setting of the vertical and horizontal sensitivity factors), saving waveforms displayed on the screen to memory, retrieving waveforms from the memory for display on the screen, printing the display, highlighting a selected displayed signal, triggering, freezing the display and providing an identification mark (similar to that provided by closing switch 16 of probe 10). Three functions are selected and are programmed within the oscilloscope to be performed when the resistance values associated with positions 1, 2 and 3 of the sliding switch 124 are sensed across the sense and ground lines.

Thus, the resistance across the terminals 32 and 34 provides the oscilloscope with two pieces of information. That is, the oscilloscope is made aware of the attenuation factor associated with the probe being utilized and is informed of a desired function which the operator wishes to implement. Preferably, a software routine relating to the desired function is stored within a memory device (not shown) of the oscilloscope and read therefrom when the oscilloscope receives an activate command signal. Such a command signal is provided by closing switch 16, which effectively shunts the resistors 24, 167 and 168 so that the resistance across the terminals 32 and 34 appears as a short circuit. Upon receiving this command signal, the oscilloscope performs the function corresponding to the selected position of the sliding member 125, the routine of which was previously stored in the memory of the oscilloscope.

By utilizing the switch 16 to supply a command signal, as previously described, activation of functions which may otherwise be premature or erroneous is avoided. For example, if the sliding member 125 is currently in position 1 and the function associated with position 3 is desired, the sliding member is moved from position 1 to position 3. In so doing, the sliding member 125 contacts terminals 133, 134 at position 2. If the function corresponding to each position of the sliding member 125 was immediately implemented, the function associated with position 2 may be implemented by the oscilloscope, even though such function is not desired.

Figure 3A:
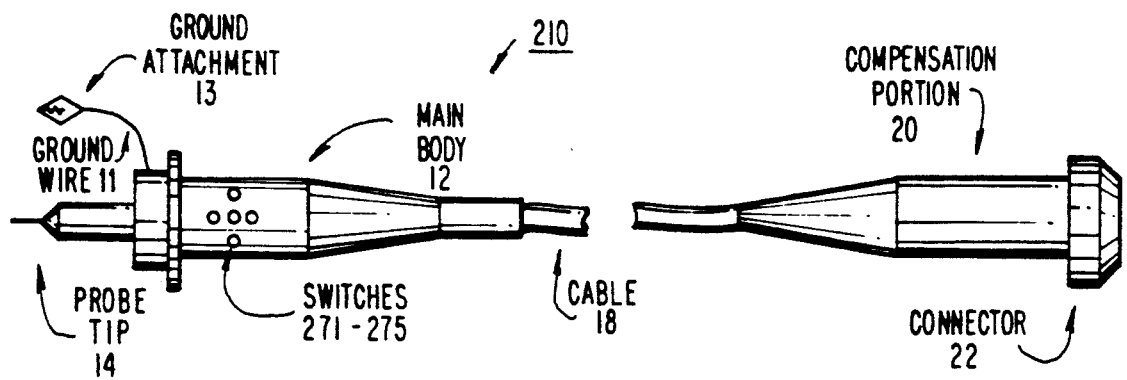
FIG. 3A illustrates an attenuation probe according to another embodiment of the present invention.
Figure 3B:
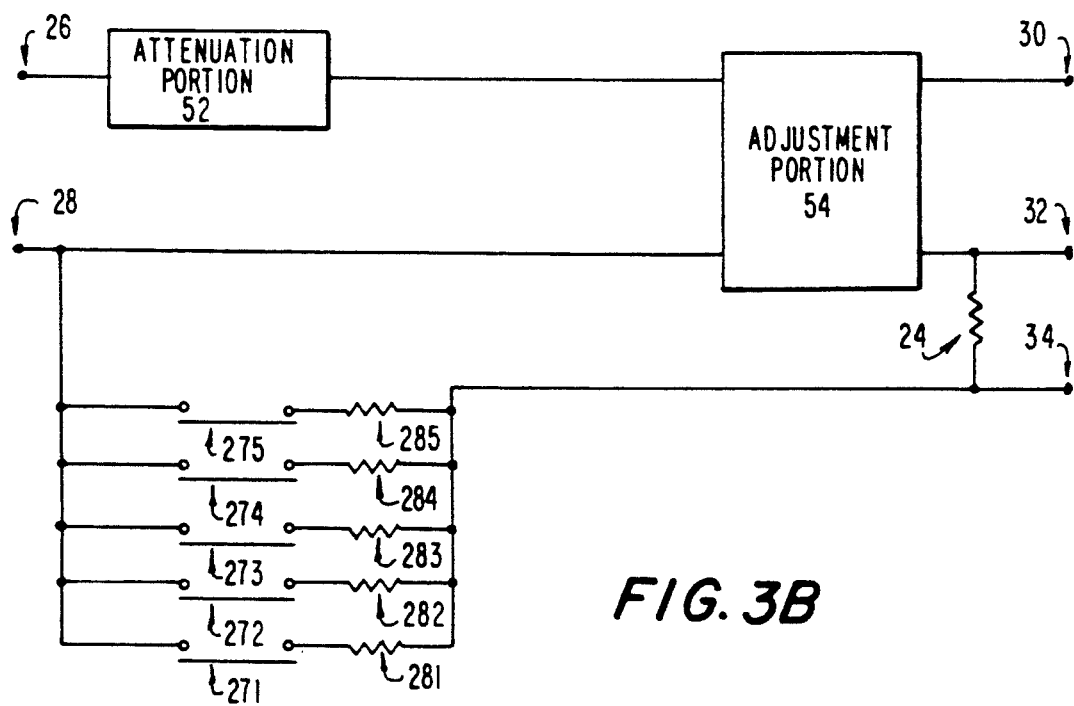
FIG. 3B a schematic diagram of the attenuation probe of FIG. 3A.

FIGS. 3A and 3B illustrate a probe 210 according to another embodiment of the present invention. As shown therein, with the exception of switches 271-275 and resistors 281-285, the probe 210 is substantially identical to the probe 110. Therefore, in the interest of brevity, only the differences associated therewith will now be described.

In the probe 210, each of the five switches 271-275, which are preferably momentary-type switches, is respectively adapted to connect one of resistors 281-285 in parallel with standard resistor 24 across the third signal line, or sense line, and the ground line. Each of the resistors 281-285 has a unique resistance value which is substantially lower than that of the resistor 24 (examples of which are illustrated in Table III below). As a result, closing (activating) one of the switches 271-275 produces a relatively low resistance across the ground and sense lines and, thus, across terminals 32 and 34, which lies outside the resistance range associated with the attenuation factor. For example, closing the switch 271 in a probe having an attenuation factor of ×10, thereby placing the resistor 281 (having a resistance of 820 ohms) in parallel with the resistor 24 (whose resistance is 12.1K ohms), produces a resistance across the terminals 32 and 34 of approximately 768 ohms. Each of the five unique relatively low resistance values connected across the terminals 32 and 34 by closing the switches 271-275, respectively, corresponds to five previously selected oscilloscope functions which are stored in a memory within the oscilloscope in a manner similar to that previously described with reference to FIGS. 2A and 2B.

TABLE III

| Attenuation Factor | $R_{24}$ (ohms) | $R_{281}$ (ohms) | $R_{282}$ (ohms) | $R_{283}$ (ohms) | $R_{284}$ (ohms) | $R_{285}$ (ohms) |
|---|---|---|---|---|---|---|
| X1 | 22K | 820 | 1.3K | 2K | 3K | 5.1K |
| X10 | 12.1K | 820 | 1.3K | 2K | 3K | 5.1K |
| X100 | 6.8K | 820 | 1.3K | 2K | 3K | 5.1K |

It will be appreciated that when all of the switches 271-275 are opened, the usual sense circuit in the oscilloscope detects a resistance across the terminals 32 and 34 equal to the value of the resistor 24 and which corresponds to the attenuation factor associated with the probe. Upon closing one of the switches 271-275, the resistance across the terminals 32 and 34 drops to a respective relatively low value, as hereinbefore described. Upon detecting such resistance, the oscilloscope activates the corresponding function. Thus, unlike the probe 110, a desired oscilloscope function may be activated from the probe 210 by closing a single switch, that is, one of the switches 271-275.

Although, as previously described, the probes 110 and 210 utilize a plurality of resistors so as to provide different resistance values across the terminals 32 and 34 which, in turn, may be measured or detected by a sense circuit in an oscilloscope, the present invention is not so limited. That is, other circuit elements, which may be either active or passive elements and which may include, for example, capacitors, inductors, transistors and diodes, or combinations thereof, may also be utilized. As a result, respective circuit values other than resistance, for example, voltage, current or time, may be detected or measured across terminals 32 and 34 by the sense circuit, whereupon the respective function identified by the sensed circuit value may be performed by the oscilloscope. As an example, a plurality of capacitors may be utilized with the resistor 24, in which a respective RC time constant is associated with each of the capacitors and the resistor. (As is to be appreciated, additional resistors may also be utilized.) Upon selecting one of the capacitors, through use of a sliding switch or one of a plurality of switches, the respective RC time constant is detected by the sense circuit in the oscilloscope whereupon the appropriate function is performed. In this example, the resistor 24 still provides an indication of the attenuation factor.

Further, although the probes 110 and 210 have been described as having three and five switches (oscilloscope functions), respectively, the present invention is not so limited and a different number of switches or a combination of switches may be utilized to connect different circuit values across the sense and ground lines in order to select difference functions to be carried out at the oscilloscope. Furthermore, a joystick-type switch may be utilized in place of the switches. Further, although the present embodiments were described with reference to attenuation voltage-sensing passive type probes, this invention is not so limited and is applicable to a number of different types of probes including, for example, voltage sensing active types and current sensing types.

While preferred embodiments and various modifications of the present invention have been described in detail herein, it is to be understood that this invention is not limited solely thereto, and other modifications and variations may be effected by one skilled in the art without departing from the spirit and scope of the invention as defined by the appended claims.

What is claimed is:

1. Signal probe apparatus for use with and for controlling a signal measuring device operable to perform a plurality of functions, said apparatus comprising:

a plurality of signal lines connectable to said signal measuring device;

means for supplying a signal to be measured to one of said signal lines;

attenuation means for attenuating said signal to be measured by a predetermined attenuation amount;

means for selectively producing different predetermined values across a number of said signal lines, each predetermined value representing a respective one of said functions to be performed by said signal measuring device, and including means for connecting different resistors across said number of said signal lines so that said different predetermined values are different resistance values, the effective resistance value nevertheless being within a predetermined range of resistance values so as to identify said attenuation amount to said signal measuring device; and activate means connected to said means for producing to provide an indication for said signal measuring device to activate the function represented by the selectively produced predetermined value, thereby controlling said signal measuring device.

2. Signal probe apparatus according to claim 1, in which the effective resistance value produced by connecting any of said different resistors across said number of said signal lines is within said predetermined range of resistance values.

3. Signal probe apparatus according to claim 1, in which the number of resistance values is at least 3, thereby enabling selection of at least 3 functions to be performed by said signal measuring device.

4. Signal probe apparatus for use with and for controlling a signal measuring device operable to perform a plurality of functions, said apparatus comprising:

a plurality of signal lines connectable to said signal measuring device;

means for supplying a signal to be measured to one of said signal lines;

a plurality of resistors, each being connectable across a number of said signal lines; and switch means selectively connecting respective ones of said resistors across said number of signal lines to produce a respective predetermined resistance value thereacross which represents a respective one of said functions so as to provide an indication for said signal measuring device to activate the respective function, thereby controlling said signal measuring device.

5. Signal probe apparatus according to claim 4, further comprising attenuation means for attenuating said signal to be measured by a predetermined attenuation amount; and wherein said plurality of resistors includes a sense resistor having a resistance within a predetermined range of resistance values so as to provide an indication of said attenuation amount to said signal measuring device.

6. Signal probe apparatus according to claim 4, in which each of said switch means includes a momentary-type switch.

7. Signal probe apparatus for use with and for controlling a signal measuring device operable to perform a plurality of functions, said apparatus comprising:

a plurality of signal lines connectable to said signal measuring device; and a body including means for supplying a signal to be measured to one of said signal lines, means for selectively producing different predetermined resistance values across a number of said signal lines, each predetermined resistance value representing a respective one of said functions to be performed by said signal measuring device, attenuation means for attenuating said signal to be measured by a predetermined attenuation amount, and activate means connected to said means for selectively producing to provide an indication for said signal measuring device to activate the function represented by the predetermined resistance value across said number of signal lines, thereby controlling said signal measuring device.

8. Signal probe apparatus according to claim 7, in which the different resistance values switched across said number of signal lines provide an effective resistance within a predetermined range of resistance values to indicate said attenuation amount to said signal measuring device.

9. Signal probe apparatus according to claim 8, in which the effective resistance value connected across said number of signal lines is within said predetermined range of resistance values regardless of the resistance value that is switched.

10. Signal probe apparatus according to claim 8, in which the number of resistance values is at least 3, thereby enabling selection of at least 3 functions to be performed by said signal measuring device.

11. Signal probe apparatus according to claim 7, in which said activate means comprises means for connecting a low resistance value across said number of signal lines.

12. Signal probe apparatus for use with and for controlling a signal measuring device operable to perform a plurality of functions, said apparatus comprising:

a plurality of signal lines connectable to said signal measuring device; and a body including means for supplying a signal to be measured to one of said signal lines, a sense resistor connected across a number of signal lines, attenuation means for attenuating said signal to be measured by a predetermined attenuation amount, and a plurality of resistors each being selectively connectable with said sense resistor so as to selectively change a predetermined resistance value across said number of signal lines to a respective predetermined resistance value which represents a respective one of said functions so as to provide an indication for said signal measuring device to activate the respective function, thereby controlling said signal measuring device.

13. Signal probe apparatus according to claim 12, wherein said sense resistor has a resistance value within a predetermined range of resistance values to provide an indication of said attenuation amount to said signal measuring device.

14. Signal probe apparatus according to claim 13, in which each of said resistors, when connected with said sense resistor, provides an effective resistance value outside said predetermined range of resistance values.

15. Signal probe apparatus for use with a signal measuring device operable to perform a plurality of functions, said apparatus comprising:

a plurality of signal lines including ground and sense lines connectable to said signal measuring device;

means for supplying a signal to be measured to one of said signal lines;

attenuation means for attenuating said signal to be measured by a predetermined attenuation amount;

switching means including a sensor resistor connected across said ground and sense lines and having a resistance representing said attenuation amount, and a plurality of additional resistors each being individually connectable in parallel with said sense resistor for selectively producing different predetermined effective resistance values across said ground and sense lines, each predetermined effective resistance value representing a respective one of said functions to be performed by said signal measuring device, the effective resistance value nevertheless being within a predetermined range of resistance values so as to identify said attenuation amount to said signal measuring device; and activate means connected to said switching means to provide an indication to said signal measuring device to activate the function represented by the selectively produced predetermined effective resistance value.

16. Signal probe apparatus for use with a signal measuring device operable to perform a plurality of functions, said apparatus comprising:

a plurality of signal lines connectable to said signal measuring device;

means for supplying a signal to be measured to one of said signal lines;

attenuation means for attenuating said signal to be measured by a predetermined attenuation amount;

a plurality of resistors each being connectable across a number of said signal lines, said plurality of resistors including a sense resistor having a resistance within a predetermined range of resistance values so as to provide an indication of said attenuation amount to said signal measuring device; and a plurality of switch means each selectively connecting a respective resistor in parallel with said sense resistor to provide an effective resistance value across said number of lines outside said predetermined range of resistance values which represents a respective one of said functions and thereby provide an indication to said signal measuring device to activate the respective function.

17. Signal probe apparatus for use with a signal measuring device operable to perform a plurality of functions, said apparatus comprising:

a plurality of signal lines connectable to said signal measuring device; and a body including means for supplying a signal to be measured to one of said signal lines, attenuation means for attenuating said signal to be measured by a predetermined attenuation amount, a sense resistor connected across a number of signal lines, and a plurality of switchable resistors each including a respective resistor connected to a momentary-type switch and each being selectively connectable in parallel with said sense resistor so as to selectively change a predetermined resistance value across said number of signal lines to a respective predetermined resistance value which represents a respective one of said functions and thereby provides an indication to said signal measuring device to activate the respective function.

* * * * *